United States Patent
Batterywala et al.

(10) Patent No.: US 9,043,741 B2
(45) Date of Patent: May 26, 2015

(54) LEGALIZING A PORTION OF A CIRCUIT LAYOUT

(75) Inventors: Shabbir H. Batterywala, Bangalore (IN); Sambuddha Bhattacharya, Bangalore (IN); Subramanian Rajagopalan, Karnataka (IN); Hi-Keung Tony Ma, Fremont, CA (US)

(73) Assignee: SYNOPSYS, INC., Mountain View, CA (US)

(*) Notice: Subject to any disclaimer, the term of this patent is extended or adjusted under 35 U.S.C. 154(b) by 478 days.

(21) Appl. No.: 12/609,996

(22) Filed: Oct. 30, 2009

(65) Prior Publication Data

US 2011/0107286 A1    May 5, 2011

(51) Int. Cl.
    *G06F 17/50*    (2006.01)
(52) U.S. Cl.
    CPC .................. *G06F 17/5081* (2013.01)
(58) Field of Classification Search
    CPC ............ G06F 17/5081; G06F 17/5072; G06F 17/5068; G06F 17/5077; G06F 17/505; G06F 17/5045; G06F 17/5054
    USPC .......... 716/110, 111, 118, 119, 122, 132, 139
    See application file for complete search history.

(56) References Cited

U.S. PATENT DOCUMENTS

| 5,773,951 | A  | * | 6/1998 | Markowski et al. | 318/625 |
| 6,083,275 | A  | * | 7/2000 | Heng et al. | 716/52 |
| 7,328,420 | B1 | * | 2/2008 | Datta et al. | 716/102 |
| 7,716,612 | B1 | * | 5/2010 | Gupta et al. | 716/132 |
| 2008/0086708 | A1 | * | 4/2008 | Rittman | 716/11 |
| 2008/0087918 | A1 | * | 4/2008 | Arendt | 257/197 |
| 2009/0031264 | A1 | * | 1/2009 | Rittman et al. | 716/5 |
| 2009/0055780 | A1 | * | 2/2009 | Acar et al. | 716/2 |
| 2009/0083689 | A1 | * | 3/2009 | Ringe et al. | 716/12 |

* cited by examiner

*Primary Examiner* — Vuthe Siek
(74) *Attorney, Agent, or Firm* — Park, Vaughan, Fleming & Dowler LLP; Laxman Sahasrabuddhe

(57) ABSTRACT

A layout-legalizing system modifies a portion of a circuit layout that is selected by a user to generate a modified portion that satisfies a set of technology constraints and a set of design constraints. The system receives as input the set of technology constraints which a semiconductor manufacturing foundry requires the circuit layout to satisfy for manufacturability purposes. The system also receives a set of design constraints from the user which restricts how objects in the portion of the circuit layout can be modified to satisfy the set of technology constraints. The system can further receive a selection input from the user which identifies the portion of the circuit layout which is to be legalized. The system then modifies the identified portion of the circuit layout to obtain a modified portion which satisfies the set of design constraints and at least a subset of the set of technology constraints.

19 Claims, 7 Drawing Sheets

LEGALIZING A PORTION OF A CIRCUIT LAYOUT

BACKGROUND

1. Technical Field

This disclosure generally relates to electronic design automation. More specifically, this disclosure relates to methods and apparatuses for legalizing a portion of a circuit layout.

2. Related Art

Advancements in process technology have impacted IC manufacturing in two key ways. First, scaling of device geometry achieved through sub-wavelength lithography has facilitated packing more devices in a chip. Second, different process recipes have enabled manufacturing of heterogeneous devices with different threshold and supply voltages in the same die. The result of these improvements, however, has been an explosion in the number of design rules that need to be obeyed in the layout. Instead of simple width and spacing rules, today's technologies prescribe complex contextual rules that have to be obeyed for manufacturability.

The increase in the number of rules has complicated the task of creating design rule clean layouts, i.e., layouts that do not have design rule violations. Creating design rule clean layouts for digital circuit designs may be possible if standard cell layouts are available as building blocks, and placement and routing tools are extended to address the design rules.

Unfortunately, this approach does not work for analog, RF and custom circuit designs. This is because such layouts are typically created manually using layout editors. Therefore, correcting design rule violations requires tedious manual edits. Furthermore, analog and RF circuit designs undergo multiple iterations between the circuit sizing and layout creation. This further complicates the issue of creating design rule clean layouts.

SUMMARY

Some embodiments provide systems and techniques for legalizing a portion of a circuit layout. More specifically, a system can automatically modify a user-selected portion of the circuit layout so that the modified circuit layout satisfies a set of technology constraints and a set of design constraints.

During operation, the system can receive the set of technology constraints which a semiconductor manufacturing foundry requires the circuit layout to satisfy for manufacturability purposes. Also, the system can receive a set of design constraints from the user which restricts how objects in the portion of the circuit layout can be modified to satisfy the set of technology constraints. The system can further receive a selection input from the user which identifies the portion of the circuit layout which is to be legalized. The system then modifies the identified portion of the circuit layout to obtain a modified portion of the circuit layout which satisfies the set of design constraints and at least a subset of the set of technology constraints.

Note that, if all of the technology constraints are satisfiable, then the subset of the set of technology constraints is equal to the set of technology constraints. However, since the design constraints restrict the modifications that the system can perform, the system may not be able to satisfy all of the technology constraints. In response to determining that not all of the technology constraints can be satisfied simultaneously, the system can determine a maximal set of technology constraints that can be satisfied, and can modify the portion of the circuit layout to satisfy this maximally satisfiable set of technology constraints.

When modifying the user-selected portion of the circuit layout, the system preserves connectivity between objects that lie within the selected portion of the circuit layout and objects that lie outside the selected portion. To do so, the system first identifies an object that intersects a boundary of the portion of the circuit layout at an intersection point. Then, the system fixes the intersection point so that modifying the portion of the circuit layout does not cause the object to intersect the boundary at a different intersection point.

The system can include a layout editor which allows a user to specify design constraints for the circuit layout. For example, the user can use the layout editor to specify spatial relationships among objects that must be preserved during legalization. The system can generate design constraints that enable the system to legalize a portion of the circuit layout while satisfying the user's design intent, e.g., the instructions for preserving the spatial relationships among objects.

For example, a design constraint in the set of design constraints can require that a set of objects be moved as a group during legalization. Another design constraint in the set of design constraints can require that an object be aligned along an axis during legalization, or can require that a dimension of an object be preserved during legalization. A further design constraint in the set of design constraints can require that symmetry between two objects be preserved during legalization. Furthermore, yet another design constraint in the set of design constraints can require that a shield be preserved around an object during legalization, or can require that an object's location remain fixed during legalization. These design constraints have been presented for illustration purposes only, and are not intended to restrict the present invention.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatuses. These modules or apparatuses may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatuses are activated, they perform the methods and processes included within them.

Integrated Circuit (IC) Design Flow

Figure 1:
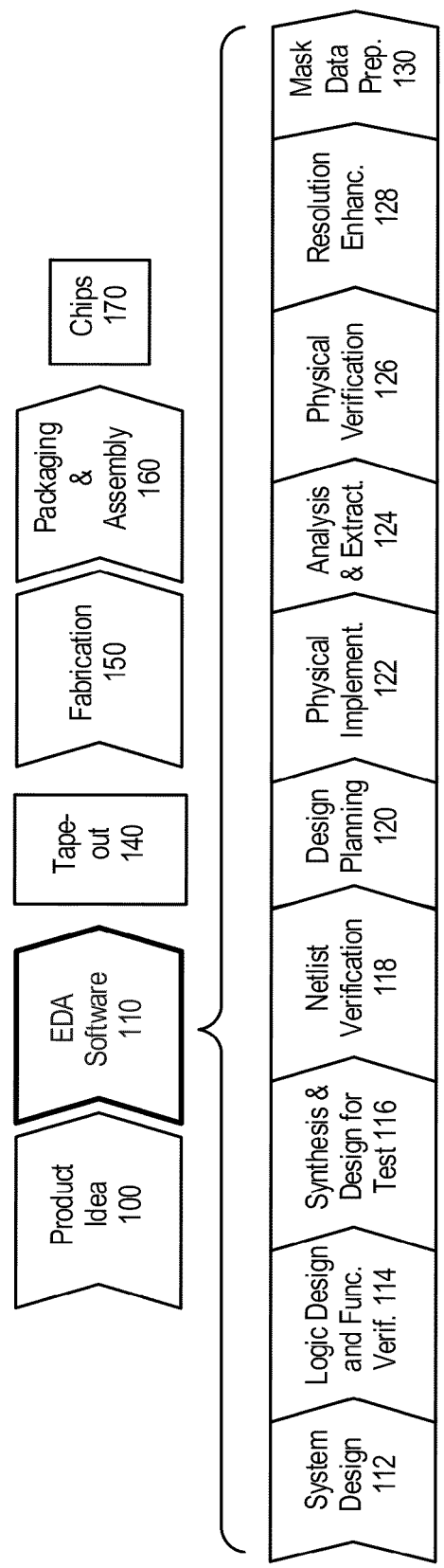
FIG. 1 illustrates various stages in the design and fabrication process of an integrated circuit.

FIG. 1 illustrates various stages in the design and fabrication process of an integrated circuit. Note that the work flow shown in FIG. 1 is for illustration purposes only, and is not intended to limit the present invention.

The IC design process typically begins with a product idea (operation 100) which is realized using an EDA process (operation 110). Once the design is finalized, it is typically taped-out (event 140), at which point it goes through a fabrication process (operation 150) and packaging and assembly processes (operation 160) to produce manufactured microchips (result 170).

The EDA process (operation 110) comprises operations 112-130, which are described below for illustrative purposes only and are not meant to limit the present invention. Specifically, an actual integrated circuit design may require a designer to perform the design operations in a different sequence than the sequence described below.

System design (operation 112): In this stage, the designers describe the functionality that implements the product idea. They can also perform what-if planning to refine the functionality, perform cost analysis, etc. Hardware-software architecture partitioning can occur at this stage. Exemplary EDA software products from Synopsys, Inc. that can be used at this stage include Model Architect, Saber®, System Studio, and DesignWare®.

Logic design and functional verification (operation 114): At this stage, the VHDL or Verilog code for modules in the system is written and the design is checked for functional accuracy. More specifically, the design is checked to ensure that it produces a correct response. Exemplary EDA software products from Synopsys, Inc. that can be used at this stage include VCS®, Vera®, DesignWare®, Magellan™, Formality®, ESP and Leda®.

Synthesis and design for test (operation 116): The VHDL/Verilog source code can be translated to a netlist in this stage. The netlist can be optimized for the target technology, and tests can be designed and implemented to check the manufactured microchips. Exemplary EDA software products from Synopsys, Inc. that can be used at this stage include Design Compiler®, Physical Compiler®, Test Compiler, Power Compiler™, FPGA Compiler, TetraMAX®, and DesignWare®.

Netlist verification (operation 118): In this stage, the netlist is checked for compliance with timing constraints and for correspondence with the VHDL/Verilog source code. Exemplary EDA software products from Synopsys, Inc. that can be used at this stage include Formality®, PrimeTime®, and VCS®.

Design planning (operation 120): In this stage, an overall floorplan for the microchip is constructed and analyzed for timing and top-level routing. Exemplary EDA software products from Synopsys, Inc. that can be used at this stage include Astro™ and IC Compiler products.

Physical implementation (operation 122): The placement (positioning of circuit elements) and routing (placement of interconnections) occur at this stage. Exemplary EDA software products from Synopsys, Inc. that can be used at this stage include Astro™ and IC Compiler products.

Analysis and extraction (operation 124): At this stage, the circuit function is verified at a transistor level; this, in turn, permits what-if refinement. Exemplary EDA software products from Synopsys, Inc. that can be used at this stage include AstroRail™, PrimeRail, PrimeTime®, and Star-RCXT™.

Physical verification (operation 126): In this stage, the design is checked to ensure correctness for manufacturing, electrical issues, lithographic issues, and circuitry. Hercules™ is an exemplary EDA software product from Synopsys, Inc. that can be used at this stage.

Resolution enhancement (operation 128): This stage involves geometric manipulations of the layout to improve manufacturability of the design. Exemplary EDA software products from Synopsys, Inc. that can be used at this stage include Proteus/Progen, ProteusAF, and PSMGen.

Mask data preparation (operation 130): This stage provides the "tape-out" data for production of masks to produce finished chips. Exemplary EDA software products from Synopsys, Inc. that can be used at this stage include the CATS® family of products.

The above-described flow has been presented for illustration purposes only and is not intended to limit the present invention to the forms disclosed. Specifically, an analog design flow may include the following stages: a product idea, architecture definition, system design and simulation, schematic design and simulation, layout design, prototype and testing, resolution enhancement, and mask data preparation.

Layout Legalization System

Figure 2:
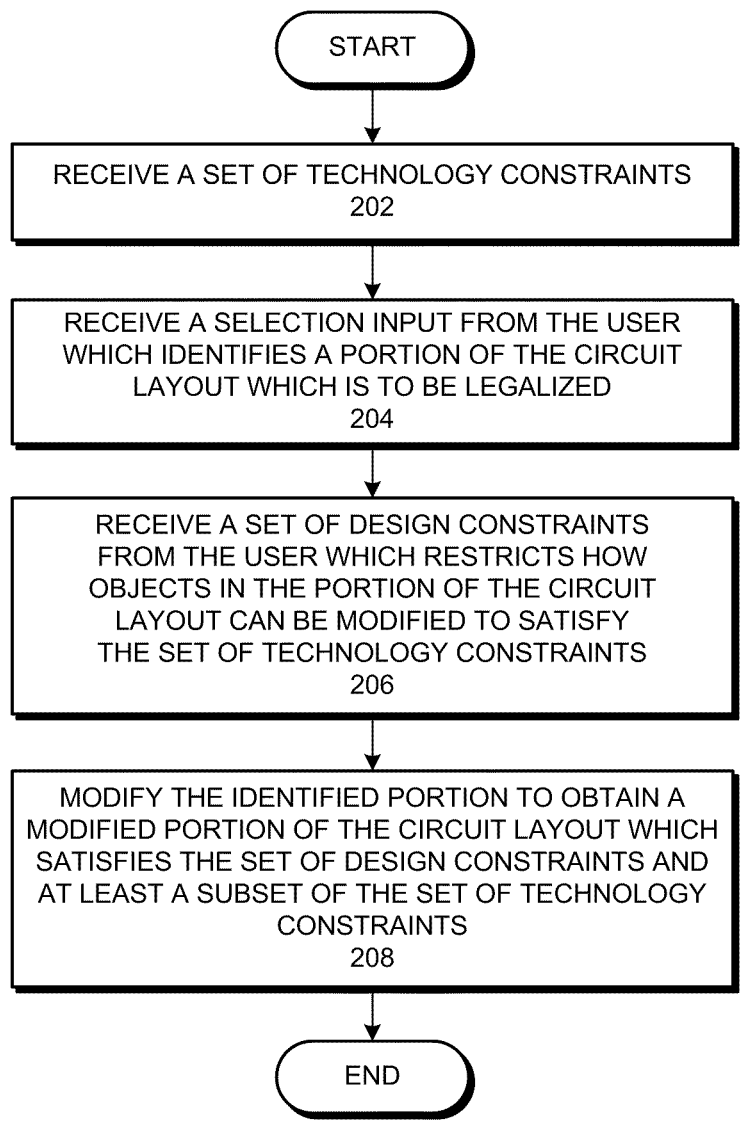
FIG. 2 presents a flow chart illustrating a process for legalizing a circuit layout in accordance with an embodiment of the present invention.

FIG. 2 presents a flow chart illustrating a process for legalizing a circuit layout in accordance with an embodiment of the present invention.

The process can be performed by a computer system which stores instructions and executes these instructions using a processing unit such as a microprocessor. The process can begin by receiving a set of technology constraints which a semiconductor manufacturing foundry requires the circuit layout to satisfy for manufacturability purposes (operation 202). Note that the technology constraints can include the design rules that the foundry provided to the EDA user.

Next, the system can receive a selection input from the user which identifies a portion of the circuit layout which is to be legalized (operation 204).

The system can then receive a set of design constraints from the user which restricts how objects in the portion of the circuit layout can be modified to satisfy the set of technology constraints (operation 206).

Note that the term "legalization" and similar terms, as used in this disclosure, generally refer to an automatic process or operation for modifying a layout so that the layout satisfies a set of technology constraints. The legalization process is automatic in the sense that a user does not manually perform the specific modifications to the layout to satisfy the technology constraints.

Next, the system can modify the portion of the circuit layout to obtain a modified portion of the circuit layout which satisfies the set of design constraints and at least a subset of the set of technology constraints (operation 208). Note that the design constraints themselves can also cause modification of the circuit layout, e.g., by modifying alignments, dimensions within the circuit layout which currently do not comply with the design constraints. Further, design constraints can also include relative position constraints, e.g., constraints which specify whether a shape needs to remain on left/right/top/bottom of another shape.

Note that the system may not be able to satisfy all of the technology constraints because the design constraints restrict the modifications that can be made to the layout. In some embodiments, the system can order the set of technology constraints, and try to satisfy them in that order. If a technology constraint cannot be satisfied, the system can skip the technology constraint and try to satisfy the remaining technology constraints in the set of technology constraints.

In some embodiments, the system can check whether all of the technology constraints can be satisfied. In response to determining that not all of the technology constraints can be satisfied simultaneously, the system can then identify a maximal subset of technology constraints that is satisfiable, and then modify the layout so that the modified layout satisfies the maximally satisfiable subset of technology constraints.

Figure 3:
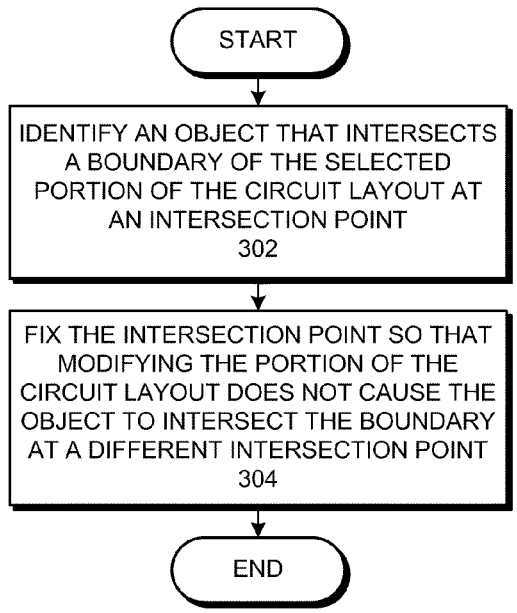
FIG. 3 presents a flow chart illustrating a process for modifying a portion of a circuit layout to satisfy a set of constraints in accordance with an embodiment of the present invention.

FIG. 3 presents a flow chart illustrating a process for fixing an intersection point while modifying a portion of a circuit layout in accordance with an embodiment of the present invention.

The system can begin by identifying an object that intersects a boundary of the selected portion of the circuit layout at an intersection point (operation 302). Next, the system can fix the intersection point so that modifying the portion of the circuit layout does not cause the object to intersect the boundary at a different intersection point (operation 304). The system can then modify the identified portion of the circuit layout to obtain a modified portion of the circuit layout which satisfies the set of design constraints and at least a subset of technology constraints. Note that, by fixing the intersection point, the system can ensure that modifications to the portion of the circuit layout maintain electrical connectivity across the boundary.

A user can use a GUI of a layout editor to specify object placements and/or configurations which must be preserved during legalization. The user's input via the GUI can be used to generate design constraints which restrict how the system modifies objects in the circuit layout to satisfy a set of technology constraints. The following paragraphs describe examples of design constraints. These examples are not intended to be exhaustive or to limit the present invention. Specifically, many modifications and variations will be apparent to practitioners skilled in the art.

Figure 4:
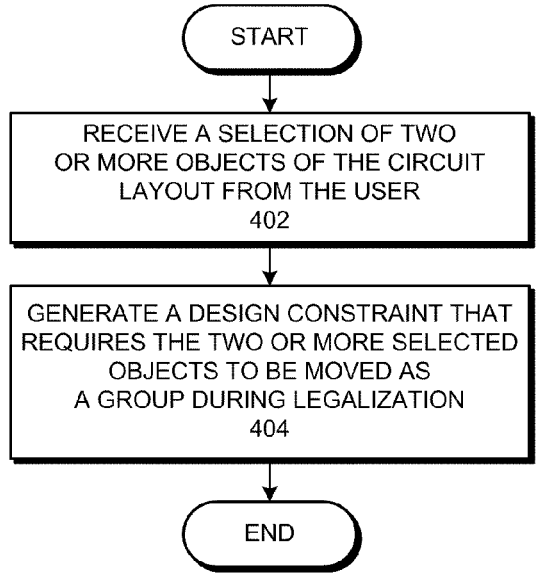
FIG. 4 presents a flow chart illustrating a process for generating a design constraint for moving a set of objects as a group during legalization in accordance with an embodiment of the present invention.

FIG. 4 presents a flow chart illustrating a process for generating a design constraint for moving a set of objects as a group during legalization in accordance with an embodiment of the present invention. The system can begin by receiving a selection of one or more objects in the circuit layout from the user (operation 402). Then, the system can generate a design constraint that requires the one or more selected objects to be moved as a group during legalization (operation 404).

Figure 5:
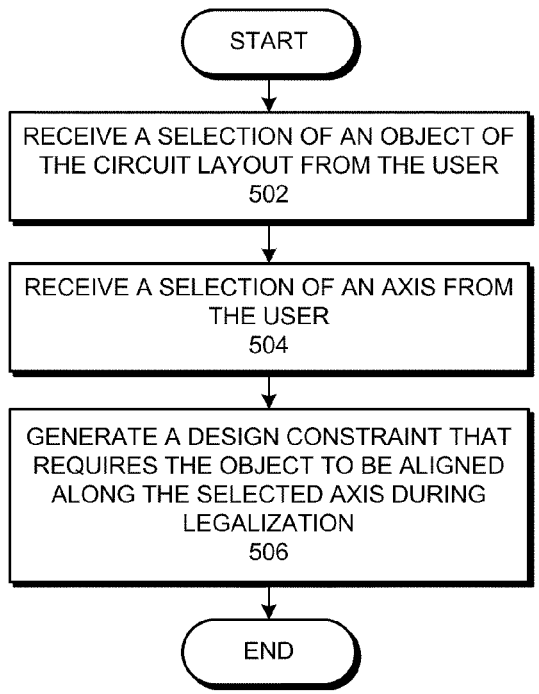
FIG. 5 presents a flow chart illustrating a process for generating a design constraint for aligning at least one object to an axis of the circuit layout during legalization in accordance with an embodiment of the present invention.

FIG. 5 presents a flow chart illustrating a process for generating a design constraint for aligning at least one object along an axis during legalization in accordance with an embodiment of the present invention. The system can begin by receiving a selection of at least one object in the circuit layout from the user (operation 502), and receiving a selection of an axis from the user (operation 504). Then, the system generates a design constraint that configures the at least one object to be aligned along the selected axis during legalization (operation 506). For example, a user can select a horizontal axis or a vertical axis, and can select an object that the user desires to be aligned along this axis. Then, during legalization, the system can move the object's position so that the object is aligned along the axis.

Figure 6:
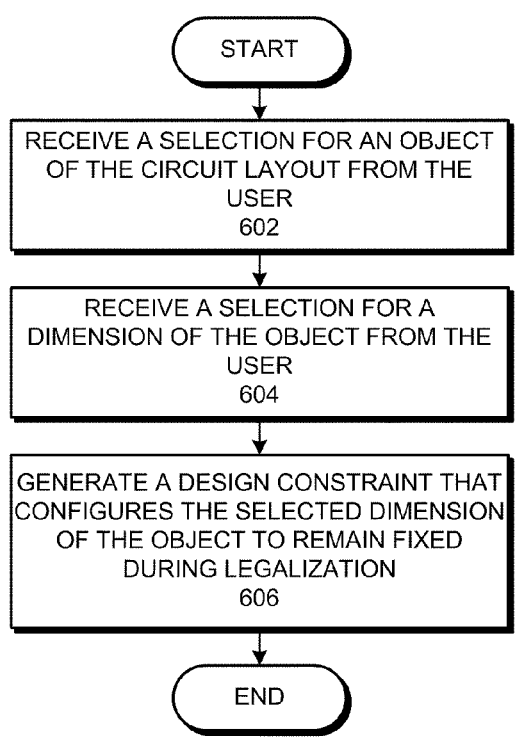
FIG. 6 presents a flow chart illustrating a process for generating a design constraint for preserving a dimension of an object during legalization in accordance with an embodiment of the present invention.

FIG. 6 presents a flow chart illustrating a process for generating a design constraint for preserving a dimension of an object during legalization in accordance with an embodiment of the present invention. The system can begin by receiving a selection of an object in the circuit layout from the user (operation 602), and receiving a selection of a dimension of the object from the user (operation 604). Then, the system can generate a design constraint that requires the selected dimension of the object to remain fixed during legalization (operation 604). For example, the user can select an object and specify whether the object's horizontal dimension (e.g., width) or vertical dimension (e.g., height) is to be kept constant.

Another example of a design constraint is the wide metal preservation constraint, which ensures that shapes that are drawn on purpose with widths that are greater than the minimum width are not shrunk during legalization.

Figure 7:
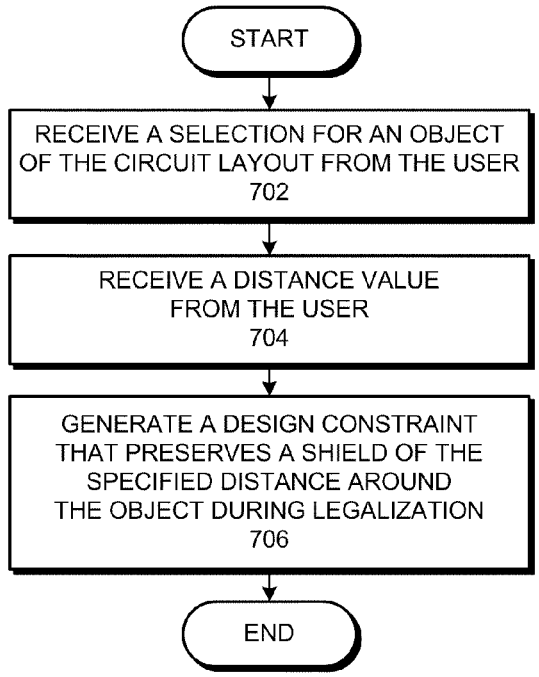
FIG. 7 presents a flow chart illustrating a process for generating a design constraint for preserving a shield around an object during legalization in accordance with an embodiment of the present invention.

FIG. 7 presents a flow chart illustrating a process for generating a design constraint for preserving a shield around an object during legalization in accordance with an embodiment of the present invention. The system can begin by receiving a selection of an object in the circuit layout from the user (operation 702), and receiving a distance value from the user (operation 704). The system can then generate a design constraint that preserves a shield of the specified distance around the object during legalization (operation 706).

For example, a user can select a circuit element, and instruct the system to preserve a shield of a given distance around the circuit element during legalization. Then, during legalization, when the system modifies the placement of other objects to satisfy design or technology constraints, the system does not place these objects within the specified shield distance around the selected circuit element. Further, if a second object is already placed in the specified shield distance before legalization, the system may move the second object away so that the second object is outside the shield.

Figure 8:
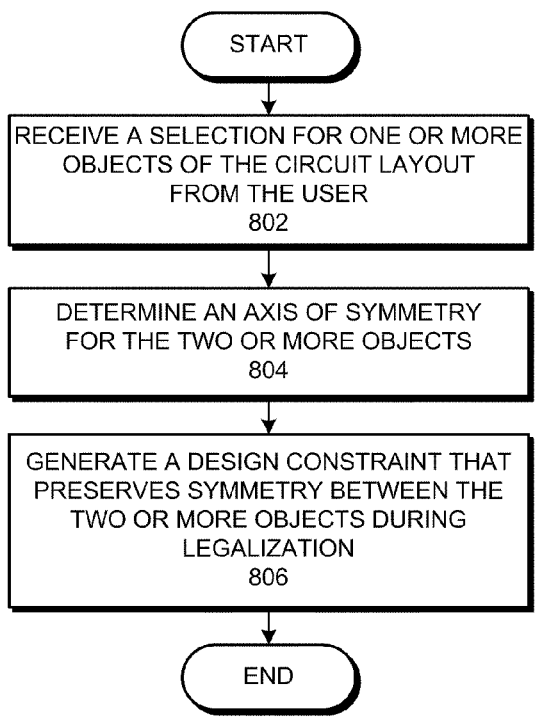
FIG. 8 presents a flow chart illustrating a process for generating a design constraint for preserving symmetry between two objects during legalization in accordance with an embodiment of the present invention.

FIG. 8 presents a flow chart illustrating a process for generating a design constraint for preserving symmetry between two or more objects during legalization in accordance with an embodiment of the present invention. The system can begin by receiving a selection of two or more objects in the circuit layout from the user (operation 802). Then, if an axis of symmetry is not provided, the system can determine an axis of symmetry for the two or more objects (operation 804). For example, the system can specify an axis of symmetry between two objects as the centerline between the two objects. In some variations, the user can select a third object, and the system can use a line passing through the center of the third object as the axis of symmetry. In other variations, the user can explicitly specify an axis of symmetry by drawing the axis using the GUI of the layout editor. The system can then generate a design constraint that preserves symmetry between the two or more objects during legalization (operation 806).

Figure 9:
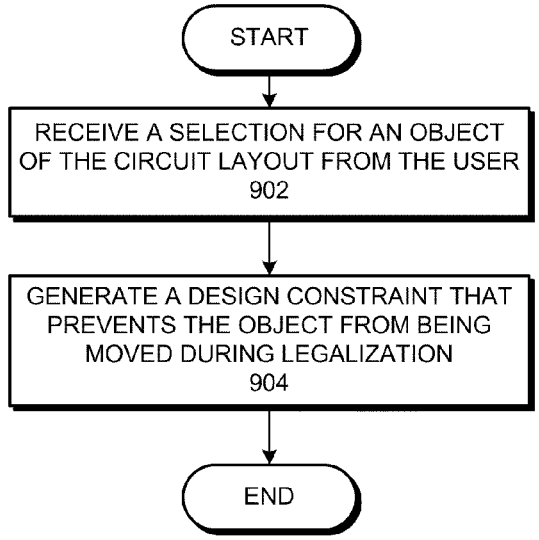
FIG. 9 presents a flow chart illustrating a process for generating a design constraint for preserving a placement of an object during legalization in accordance with an embodiment of the present invention.

FIG. 9 presents a flow chart illustrating a process for generating a design constraint which fixes the location of an object during legalization in accordance with an embodiment of the present invention. The system can begin by receiving a selection of an object in the circuit layout from the user (operation 902). Then, the system can generate a design constraint that prevents the object from being moved during legalization (operation 904). In some embodiments of the present invention, the system can also generate a design constraint to fix the location of a set of objects.

In some embodiments of the present invention, the system allows the user to accept or reject a legalized layout based on the user's decision. More specifically, if the user decides to accept the legalized layout, the user can save the legalized layout, which subsequently overwrites the original layout. On the other hand, if the user decides to reject the legalized layout (for example, upon seeing the legalized layout in the layout editor), the user can reject the changes by performing an "undo" operation, which then keeps the original layout.

In some embodiments of the present invention, the system is configured to keep instantiated layout components (e.g., layout components which are pre-verified for any DRC violation) unchanged during legalization. This property can be especially useful when constructing a layout bottom up in a hierarchical approach. More specifically, while the "instances" can be moved around (i.e., translated) by the legalizer when such moves are needed to fix any violation, the internal constructions of these instances are not modified or affected. As a result, the layout hierarchy is retained and pre-verified instances are not modified during legalization.

In some embodiments of the present invention, the legalizer can also be configured to operate primarily on the geometries visible on a layout editor. More specifically, the legalizer can be configured such that any layout geometry below a given hierarchy level is invisible and hence ignored by the legalizer. While the legalizer operates on the visible portion of the layout, the legalizer treats the invisible portions as black boxes and keeps them un-modified.

Figure 10:
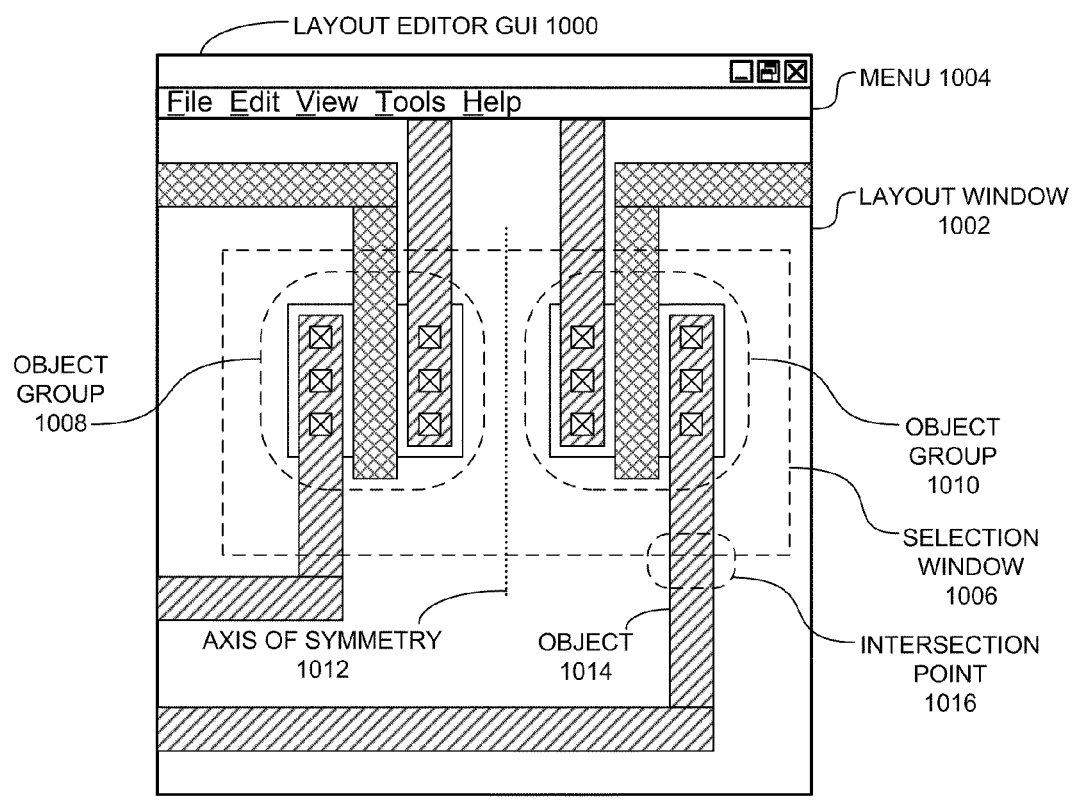
FIG. 10 illustrates an exemplary graphical user interface for a layout editor in accordance with an embodiment of the present invention.

FIG. 10 illustrates an exemplary graphical user interface for a layout editor in accordance with an embodiment of the present invention. Layout editor GUI 1000 can include a layout window 1002 that presents a layout of a circuit design and enables a user to edit the layout. Menu 1004 can provide the user access to additional software options and/or capabilities. Furthermore, the user can specify design constraints via layout window 1002 which restrict how the system modifies the circuit layout during legalization.

For example, the user can use a mouse pointer to select multiple objects displayed on layout window 1002, and can select a "Group Objects" option from menu 1004 (or can press a key combination on a keyboard) to instruct the system to move the objects as a group during legalization. For example, the user may use this capability to ensure that a set of circuit elements that form a component are moved as a group during legalization.

The user can also use the mouse pointer to select two or more objects on layout window 1002 (e.g., objects in object groups 1008 and 1010), and can select an option from menu 1004 (or can press a key combination) to instruct the system to preserve symmetry between the two or more objects during legalization. For example, the system may preserve symmetry between object groups 1008 and 1010 along an axis of symmetry 1012. For example, the user may use this capability to ensure that a set of matched transistors remain matched if the layout is modified during legalization.

The user can use the mouse pointer to draw a selection window 1006 within which legalization is desired to be performed. Legalization may be initiated as soon as the user selects window 1006, or it may be initiated when the user specifically issues a legalization command to the system (e.g., by selecting a legalization command in menu 1004). The system can identify objects that intersect selection window 1006 (e.g., object 1014 intersects selection window 1006 at intersection point 1016). The system can then fix intersection point 1016 so that modifying object group 1010 does not cause object 1014 to intersect selection window 1006 at a different intersection point. This capability can ensure that the connectivity of object 1014 is maintained during legalization.

A selection window can generally be of any shape and/or size. Specifically, a selection window can be non-rectangular, e.g., a circle or a generic polygon. Alternatively, it is possible to configure the legalizer to operate in a way that it modifies only geometries outside the selection window, but leaves geometries inside the selection window unaltered. Further, the legalizer can enable a user to identify multiple selection windows at once for performing legalization.

In some embodiments, the legalizer can be configured to work with a design rule checker tool (e.g., Hercules™). More specifically, the design rule checker tool can point to a location in the layout where a violation exists, which subsequently causes a window-based legalization process to be invoked around that location. This process can be automated such that the legalization operations are attempted sequentially or in parallel at each violation location in the layout.

Figure 11:
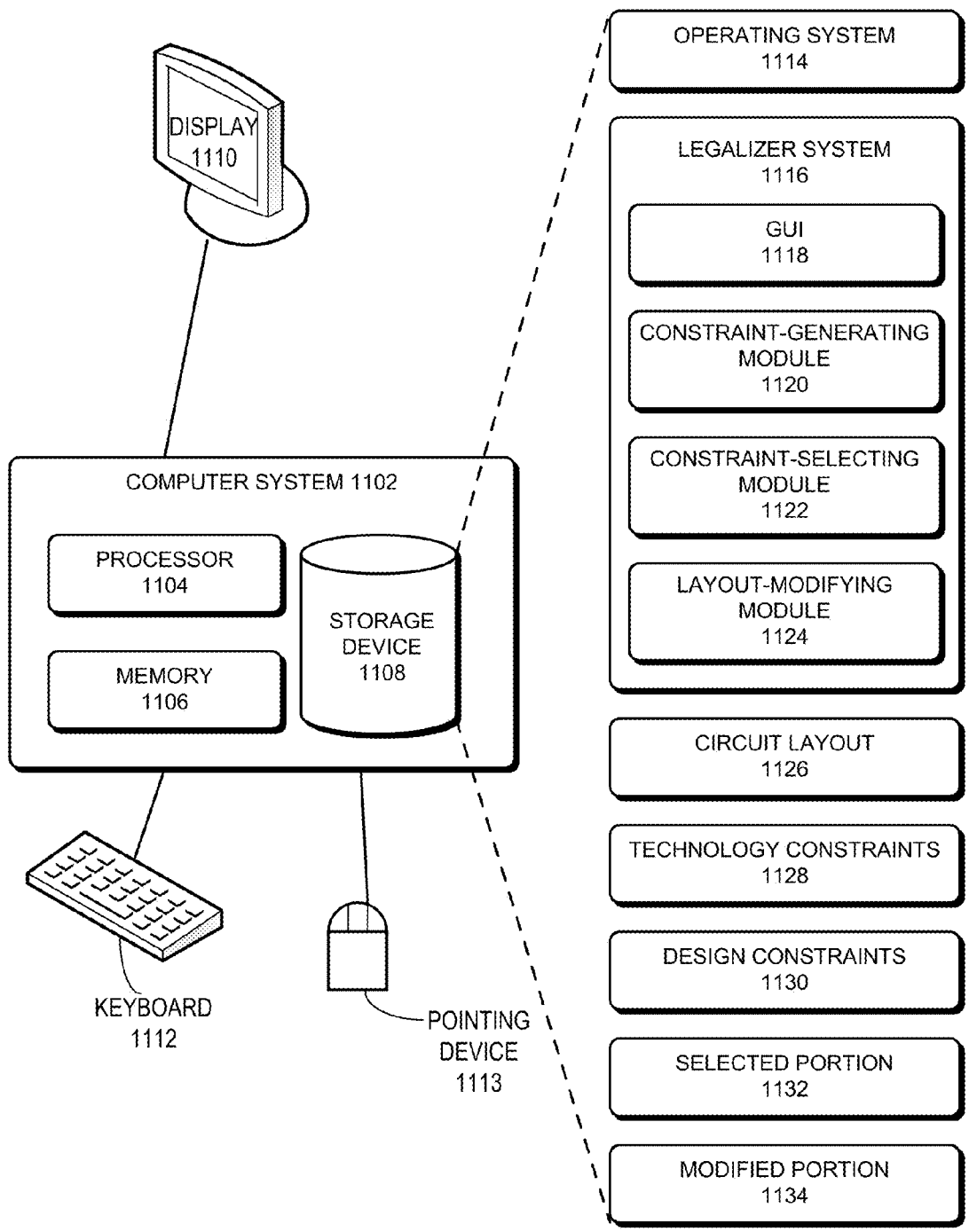
FIG. 11 illustrates an exemplary computer system that facilitates legalizing a portion of a circuit layout in accordance with an embodiment of the present invention.

FIG. 11 illustrates an exemplary computer system that facilitates legalizing a portion of a circuit layout in accordance with an embodiment of the present invention. Computer system 1102 includes processor 1104, memory 1106, and storage device 1108. Furthermore, computer system 1102 can be coupled to display device 1110, keyboard 1112, and pointing device 1113.

Storage device 1108 can store operating system 1114, legalizer system 1116, circuit layout 1126, technology constraints 1128, design constraints 1130, a selected portion 1132, and a modified portion 1134. Legalizer system 1116 can include graphical user interface (GUI) 1118, constraint-generating module 1120, constraint-selecting module 1122, and layout-modifying module 1124.

During operation, legalizer system 1116 can be loaded from storage device 1108 into memory 1106 and can be executed by processor 1104. Legalizer system 1116 can take circuit layout 1126, technology constraints 1128, and design constraints 1130 as input. Furthermore, a user can use GUI 1118 to specify restrictions on how objects in circuit layout 1126 can be modified to satisfy technology constraints 1126, and constraint-generating module 1120 generates design constraints 1130 for these restrictions. A user can also use GUI 1118 to select a portion of circuit layout 1126 to legalize (i.e., selected portion 1132). Then, during legalization, constraint-selecting module 1122 can identify a subset of technology constraints 1128 that are satisfiable by selected portion 1132. Layout-modifying module 1124 can then modify selected portion 1132 to generate modified portion 1134 that satisfies design constraints 1130 and at least a subset of technology constraints 1128.

Figure 12:
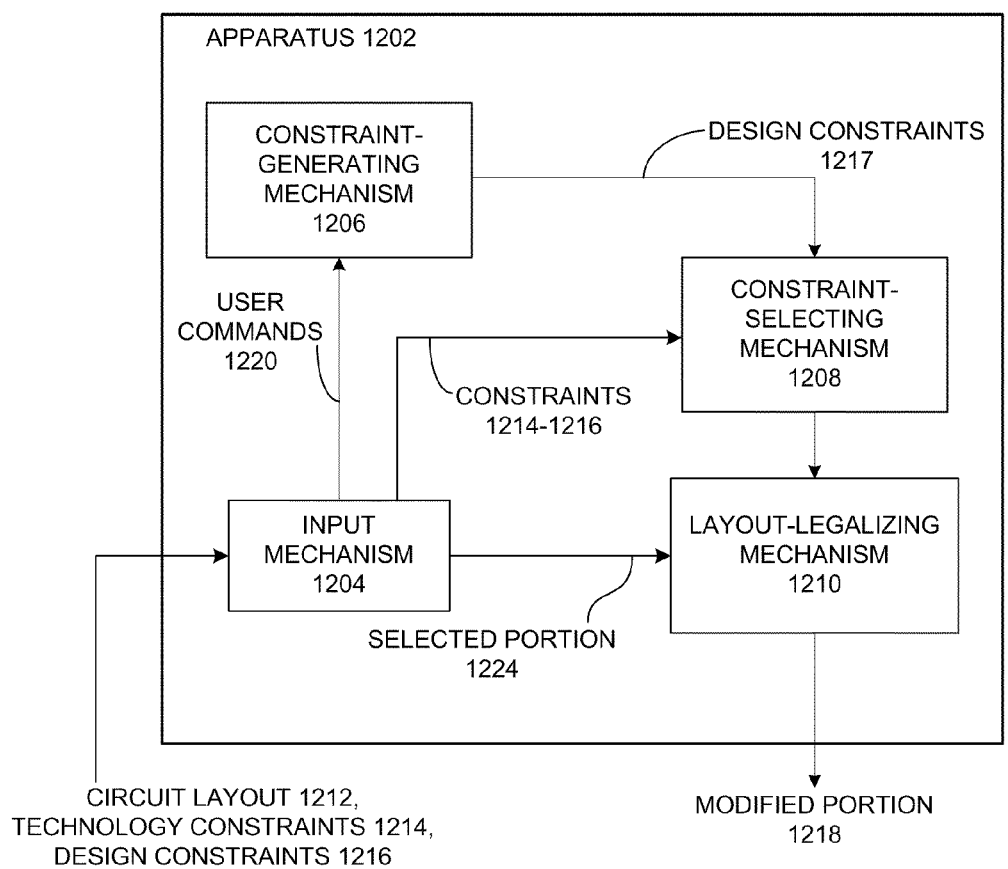
FIG. 12 illustrates an apparatus that facilitates legalizing a portion of a circuit layout in accordance with an embodiment of the present invention.

FIG. 12 illustrates an apparatus that facilitates legalizing a portion of a circuit layout in accordance with an embodiment of the present invention. Apparatus 1202 can comprise a number of mechanisms which may communicate with one another via a wired or wireless communication channel. Apparatus 1202 may be realized using one or more integrated circuits, and it may be integrated in a computer system, or it may be realized as a separate device which is capable of communicating with other computer systems and/or devices. Specifically, apparatus 1202 can include an input mechanism 1204, a constraint-generating mechanism 1206, a constraint-selecting mechanism 1208, and a layout-legalizing mechanism 1210.

In some embodiments, inputs to apparatus 1202 can include circuit layout 1212, technology constraints 1214, and design constraints 1216. Apparatus 1202 can then output modified portion 1218 of circuit layout 1212 that satisfies constraints 1214-1216. More specifically, a user can use a GUI to input user commands 1220 that specify restrictions on how objects in circuit layout 1212 can be modified to satisfy technology constraints 1214. Constraint-generating mechanism 1206 can use user commands 1220 to generate design constraints 1217. A user can also use the GUI to select a portion of circuit layout 1212 to legalize (i.e., selected portion 1224). Then, during legalization, constraint-selecting mechanism 1208 can identify a subset of technology constraints 1214 that are satisfiable. Layout-legalizing mechanism 1210 can then modify selected portion 1224 to generate modified portion 1218 that satisfies design constraints 1216-1217 and at least a subset of technology constraints 1214.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for legalizing a portion of a circuit layout, the method comprising:
    receiving a set of technology constraints which a semiconductor manufacturing foundry requires the circuit layout to satisfy for manufacturability purposes, wherein the set of technology constraints include design rules;
    receiving a set of design constraints, wherein the set of design constraints specify object placements and/or configurations that must be preserved during legalization, wherein a design constraint in the set of design constraints requires that symmetry between a first polygon and a second polygon with respect to an axis of symmetry be preserved during legalization, wherein the axis of symmetry is located between the first polygon and the second polygon; and
    modifying, by computer, a portion of the circuit layout to obtain a modified portion of the circuit layout, wherein said modifying involves modifying the size and/or shape of a first polygon to satisfy at least one technology constraint, and modifying the size and/or shape of a second polygon to preserve symmetry between the first polygon and the second polygon with respect to the axis of symmetry.

2. The method of claim 1, wherein a design constraint in the set of design constraints requires that a set of objects be moved as a group during legalization.

3. The method of claim 1, wherein a design constraint in the set of design constraints requires that an object be aligned along an axis during legalization.

4. The method of claim 1, wherein a design constraint in the set of design constraints requires that a dimension of an object be preserved during legalization.

5. The method of claim 1, wherein a design constraint in the set of design constraints requires that a shield be preserved around an object during legalization.

6. The method of claim 1, wherein a design constraint in the set of design constraints requires that an object remain fixed during legalization.

7. The method of claim 1, wherein the method further comprises identifying a maximally satisfiable subset of the set of technology constraints in response to determining that the set of technology constraints are not satisfiable.

8. The method of claim 1, wherein the subset of the set of technology constraints is equal to the set of technology constraints.

9. The method of claim 1, wherein the method further comprises:
    identifying an object that intersects a boundary of the portion of the circuit layout at an intersection point; and
    fixing the intersection point so that modifying the portion of the circuit layout does not cause the object to intersect the boundary at a different intersection point.

10. A non-transitory computer-readable storage medium storing instructions that when executed by a computer cause the computer to perform a method for legalizing a portion of a circuit layout, the method comprising:
    receiving a set of technology constraints which a semiconductor manufacturing foundry requires the circuit layout to satisfy for manufacturability purposes, wherein the set of technology constraints include design rules;
    receiving a set of design constraints, wherein the set of design constraints specify object placements and/or configurations that must be preserved during legalization, wherein a design constraint in the set of design constraints requires that symmetry between a first polygon and a second polygon with respect to an axis of symmetry be preserved during legalization, wherein the axis of symmetry is located between the first polygon and the second polygon; and
    modifying a portion of the circuit layout to obtain a modified portion of the circuit layout, wherein said modifying involves modifying the size and/or shape of a first polygon to satisfy at least one technology constraint, and modifying the size and/or shape of a second polygon to preserve symmetry between the first polygon and the second polygon with respect to the axis of symmetry.

11. The non-transitory computer-readable storage medium of claim 10, wherein a design constraint in the set of design constraints requires that a set of objects be moved as a group during legalization.

12. The non-transitory computer-readable storage medium of claim 10, wherein a design constraint in the set of design constraints requires that an object be aligned along an axis during legalization.

13. The non-transitory computer-readable storage medium of claim 10, wherein a design constraint in the set of design constraints requires that a dimension of an object be preserved during legalization.

14. The non-transitory computer-readable storage medium of claim 10, wherein a design constraint in the set of design constraints requires that a shield be preserved around an object during legalization.

15. The non-transitory computer-readable storage medium of claim 10, wherein a design constraint in the set of design constraints requires that an object remain fixed during legalization.

16. The non-transitory computer-readable storage medium of claim 10, wherein the method further comprises identifying a maximally satisfiable subset of the set of technology constraints in response to determining that the set of technology constraints are not satisfiable.

17. The non-transitory computer-readable storage medium of claim 10, wherein the subset of the set of technology constraints is equal to the set of technology constraints.

18. The non-transitory computer-readable storage medium of claim 10, wherein the method further comprises:
    identifying an object that intersects a boundary of the portion of the circuit layout at an intersection point; and
    fixing the intersection point so that modifying the portion of the circuit layout does not cause the object to intersect the boundary at a different intersection point.

19. An apparatus that legalizes a portion of a circuit layout, comprising:
    an input mechanism configured to:
        receive a set of technology constraints which a semiconductor manufacturing foundry requires the circuit layout to satisfy for manufacturability purposes, wherein the set of technology constraints include design rules; and
        receive a set of design constraints, wherein the set of design constraints specify object placements and/or configurations that must be preserved during legalization, wherein a design constraint in the set of design constraints requires that symmetry between a first polygon and a second polygon with respect to an axis of symmetry be preserved during legalization, wherein the axis of symmetry is located between the first polygon and the second polygon; and
    a layout-legalizing mechanism configured to modify the portion of the circuit layout to obtain a modified portion of the circuit layout, wherein said modifying involves modifying the size and/or shape of a first polygon to satisfy at least one technology constraint, and modifying the size and/or shape of a second polygon to preserve symmetry between the first polygon and the second polygon with respect to the axis of symmetry.

\* \* \* \* \*